(12) United States Patent
Williams

(10) Patent No.: US 11,562,378 B2
(45) Date of Patent: *Jan. 24, 2023

(54) CHRONOSTRATIGRAPHIC MODELING AND MAPPING SYSTEM AND METHOD

(71) Applicant: Enverus, Inc., Austin, TX (US)

(72) Inventor: Ralph A. Williams, Ridgway, PA (US)

(73) Assignee: Enveras, Inc., Austin, TX (US)

( * ) Notice: Subject to any disclaimer, the term of this patent is extended or adjusted under 35 U.S.C. 154(b) by 328 days.

This patent is subject to a terminal disclaimer.

(21) Appl. No.: 16/679,479

(22) Filed: Nov. 11, 2019

(65) Prior Publication Data

US 2020/0074027 A1 Mar. 5, 2020

Related U.S. Application Data

(63) Continuation of application No. 15/257,682, filed on Sep. 6, 2016, now Pat. No. 10,474,769, which is a (Continued)

(51) Int. Cl.
| | |
|---|---|
| *E21B 47/06* | (2012.01) |
| *E21B 49/00* | (2006.01) |
| *E21B 49/08* | (2006.01) |
| *G01V 99/00* | (2009.01) |
| *E21B 47/07* | (2012.01) |
| *G06Q 30/02* | (2012.01) |
| *G06F 30/20* | (2020.01) |
| *E21B 7/00* | (2006.01) |

(52) U.S. Cl.
CPC ............ *G06Q 30/02* (2013.01); *E21B 7/00* (2013.01); *E21B 47/06* (2013.01); *E21B 47/07* (2020.05); *E21B 49/00* (2013.01); *E21B 49/08* (2013.01); *G01V 99/005* (2013.01); *G06F 30/20* (2020.01); *G01V 2210/66* (2013.01)

(58) Field of Classification Search
CPC .. G06Q 30/02; E21B 7/00; E21B 47/06; E21B 47/07; E21B 49/00; E21B 49/08; G01V 99/005; G01V 2210/66; G06F 30/20
USPC .......................................................... 703/10
See application file for complete search history.

(56) References Cited

U.S. PATENT DOCUMENTS

| | | | |
|---|---|---|---|
| 6,249,746 B1 * | 6/2001 | Neff | ......................... G01V 1/28 |
| | | | 702/16 |
| 7,054,753 B1 | 5/2006 | Williams et al. | |

(Continued)

OTHER PUBLICATIONS

Gani et al., "Lithostratigraphy versus Chronostratigraphy in Facies Correlations of Quarternary Deltas: Application of Bedding Correlation," SEPM, 2005, 31-48.

*Primary Examiner* — John E Johansen
(74) *Attorney, Agent, or Firm* — Fish & Richardson P.C.

(57) ABSTRACT

A chronostratigraphic database comprising a plurality of discrete data points, wherein each data point comprises an x, y, z and T value, wherein x, y, and z are Cartesian coordinates describing a position and T is a geologic time event relative to said position; a method to produce a chronostratigraphic database and to utilize the database; and a modeling system wherein the database includes data formatted and arranged for use with a computer-implemented method or web-based method for controlling serving of an advertisement or public service message using its relevancy to a request.

32 Claims, 3 Drawing Sheets

Related U.S. Application Data continuation of application No. 13/402,747, filed on Feb. 22, 2012, now abandoned.

(60) Provisional application No. 61/445,141, filed on Feb. 22, 2011.

(56) References Cited

U.S. PATENT DOCUMENTS

| | | | |
|---|---|---|---|
| 8,515,678 B2 | 8/2013 | Pepper et al. | |
| 8,655,632 B2 | 2/2014 | Moguchaya | |
| 8,798,974 B1 * | 8/2014 | Nunns | G01V 99/005 703/6 |
| 10,474,769 B2 | 11/2019 | Williams | |
| 2010/0149917 A1 | 6/2010 | Imhof et al. | |
| 2012/0029828 A1 * | 2/2012 | Pepper | G01V 1/301 702/16 |
| 2012/0215628 A1 | 8/2012 | Williams | |
| 2018/0068037 A1 | 3/2018 | Williams | |

\* cited by examiner

CHRONOSTRATIGRAPHIC MODELING AND MAPPING SYSTEM AND METHOD

CROSS REFERENCE TO RELATED APPLICATIONS

This application is a continuation of U.S. Ser. No. 15/257,682, filed Sep. 6, 2016, which in turn is a continuation of U.S. Ser. No. 13/402,747, filed Feb. 22, 2012, which claims priority to and the benefit of provisional application U.S. 61/445,141, filed Feb. 22, 2011, all of which are hereby incorporated herein by reference in their entireties.

BACKGROUND

The statements in this section merely provide background information related to the present disclosure and may not constitute prior art.

The instant disclosure generally relates to geological modeling and mapping.

Typically, geological information collected from Earth's subsurface is identified by its spatial location, specifically geographic (x, y) coordinates, i.e., longitude and latitude, and elevation or depth (z), usually relative to mean sea level. This allows subsurface data types to be categorized, utilized and marketed based on these identifiers.

A geologic basin may be comprised of hundreds of rock layers or strata (formations) deposited over geologic time. Thus, a characteristic attribute of a stratum is the age of deposition (T), which in a sense could be considered as a fourth dimension. A geologic time scale has been created to subdivide Earth's history into eras and periods based on the absolute age of rocks, fossils and sediments using radiometric dating, paleontology and other methods. Chronostratigraphy is then used to identify the age of rock strata in relation to time and relying on absolute age. Lithostratigraphy involves the correlating of key rock sequences to map continuous geologic formations within a particular area, such as a portion of a particular basin.

A method to obtain digital spatial data and a stratigraphic correlation or framework from well logs in a particular area or basin is described in U.S. Pat. No. 7,054,753, which is fully incorporated by reference herein.

When attempting to understand a single formation or a short geographic distance, e.g., within a common basin, lithostratigraphy may match chronostratigraphy fairly well. However, changes in the strata from other geologic forces, or the arrangement of the various strata layers over relatively large geographic distances cannot readily be accounted for using lithostratigraphic correlation. Chronostratigraphic correlation becomes very difficult, if not impossible in view of the limited lithostratigraphic data that are available, which are, at best, limited, disjointed and mainly comprised of numerous forms of analog data presented as well logs recorded over the past century. What is needed therefore is an overall chronostratigraphic framework within which geologic data can be inserted and categorized along with a time event such that the data may be queried and organized based on the age as well as spatial coordinates.

SUMMARY

In a first aspect, a chronostratigraphic modeling system comprises a database comprising a plurality of discrete surface and/or subsurface data points comprising spatial coordinates (x, y, z) and one or more attributes associated therewith, including a set of age-tagged data points wherein the one or more attributes comprises an age correlation (T) associated with the respective data point, wherein the database is searchable by age and spatial coordinates.

In another aspect, a chronostratigraphic modeling method, comprises searching a searchable database comprising a plurality of discrete subsurface data points comprising spatial coordinates (x, y, z) and one or more attributes associated therewith, including a set of age-tagged data points wherein the one or more attributes comprises an age correlation (T) associated with the respective data point, and displaying the selected data points in an isochron selected from points, lines, surfaces, volumes and combinations thereof.

In still another aspect, a method to produce a chronostratigraphic database comprises:

a) scanning a plurality of well logs to create raster images;
b) digitizing the raster images to create digitized well log data;
c) normalizing the digitized well log data to a consistent scale;
d) scaling the normalized digitized well log data to emphasize the markers across multiple well logs;
e) correlating the normalized digitized well log data to identify geologic markers in each depositional stratum; and
f) correlating data points within a depositional stratum with the geologic age of the stratum.

In an embodiment, the database includes data formatted and arranged for use with a computer-implemented method for controlling serving of an advertisement or public service message using its relevancy to a request.

In an embodiment, the database includes data formatted and arranged for use with a computer-implemented method, implemented in at least one computing device, of dynamically changing the messaging in an advertisement or public service message served as an image in a web page utilizing information from a search request made by a user.

In an embodiment, the database according to the instant disclosure may be utilized for locating oil and gas drilling prospects utilizing an unprecedented quantity of digital well log data, well production histories, well test data, and any other relevant digital well data. In an embodiment, the method according to the instant disclosure is comprised of obtaining, then digitizing on a computer or other suitable digitizing apparatus, log data from a plurality of wells drilled in a desired geologic basin; then normalizing the log data from each well using a standardized scale; correlating each digitized well log to create a stratigraphic framework for the entire basin; correlating the discrete subsurface data points with one or more attributes including an age of the strata to create a chronostratigraphic framework for the one or more basins and, identifying the observable depositional features and facies for each interval in each well. The database or method according to the instant disclosure also encompasses visually displaying a plurality of individual well logs to reveal consistent depositional characteristics of a cross-sectional area.

By displaying more data simultaneously this database or method according to the instant disclosure can enable the facies changes resulting in reservoir rock to be seen and geologic time events to be correlated basin wide, or over a plurality of basins which may include an entire continent or the entire surface of the globe. The stratigraphic framework described herein can be comprised of the interpreted intersections between key strata and well bores and stored in a database or other data correlation system that facilitates the management and correlation of the vast amounts of data to be used in the current database or method according to the instant disclosure. The chronostratigraphic framework created allows data in the digital database to be queried by a single formation, a single formation age, a range of ages, or contiguous group of formations based on properties and/or age thereby providing a method for discerning the geographical distribution of existing and potential reservoir rock in a basin.

Once well logs are digitized, the recorded logs are normalized to a consistent standard so that the amount of effective reservoir rock for each stratum can be accurately calculated. The calculated quantity of reservoir rock is mapped to reveal the geographical distribution and nature of the depositional features present during that particular geologic interval of time. The type and shape of these features allow for a much more accurate projection of reservoir rock into undrilled areas of the basin, thereby creating drilling prospects.

In an embodiment, a method for locating oil and gas drilling prospects can include normalizing existing digitized well log data. The normalized digital well log data can be correlated to create a chronostratigraphic framework for an entire basin, a plurality of basins, or some part thereof, or across basins. The normalization can be performed manually or by an automated computer process. The database or method according to the instant disclosure can display a plurality of individual well logs together to reveal consistent depositional characteristics of strata in the entire basin or basins, or some part thereof. The plurality of individual well logs can be displayed to reveal consistent depositional characteristics of a cross-sectional area. Because the database or method according to the instant disclosure uses normalized digital well log data for most of its analysis, the oil and gas knowledge worker can amplify or demodulate the data to reveal additional geologic features and information that would not have been otherwise possible.

If an oil and gas knowledge worker does not already have access to sufficient digital well log data, the oil and gas knowledge worker can optionally inventory the existing digital well log data and determine the most efficient set of data for digitization. The oil and gas knowledge worker can use the claimed inventive method to optionally digitize well log data to create additional digital well log data for normalizing and correlating.

In another embodiment, an alternate method for locating oil and gas drilling prospects is described. This embodiment comprises optionally selecting well logs to be scanned based on areas of commercial interest in a basin. The optionally selected well logs or all reasonably available and necessary well logs can be scanned to create raster images. The raster images can be saved as tagged image file format (TIFF) files. The raster images can be digitized to create digital well log data. The digital well log data can be normalized to a common scale. The normalized digitized well log data can be correlated to explicitly identify key hang markers in each depositional stratum. The correlation can be performed manually, via an automated computer process, or a combination thereof. The normalized digital well log data can be scaled to emphasize explicit hang markers across multiple well logs. Each of the data points within a depositional stratum may then be correlated with the geologic age of the stratum.

Formation tops can be extracted to create a visual display of an isochronous formation surface. If alternate depictions of the available data are desired, the oil and gas knowledge worker can optionally amplify or demodulate the normalized digital well log data to show additional geological information and features.

This summary is provided to introduce a selection of concepts that are further described below in the detailed description. This summary is not intended to identify key or essential features of the claimed subject matter, nor is it intended to be used as an aid in limiting the scope of the claimed subject matter.

DETAILED DESCRIPTION

Figure 1:
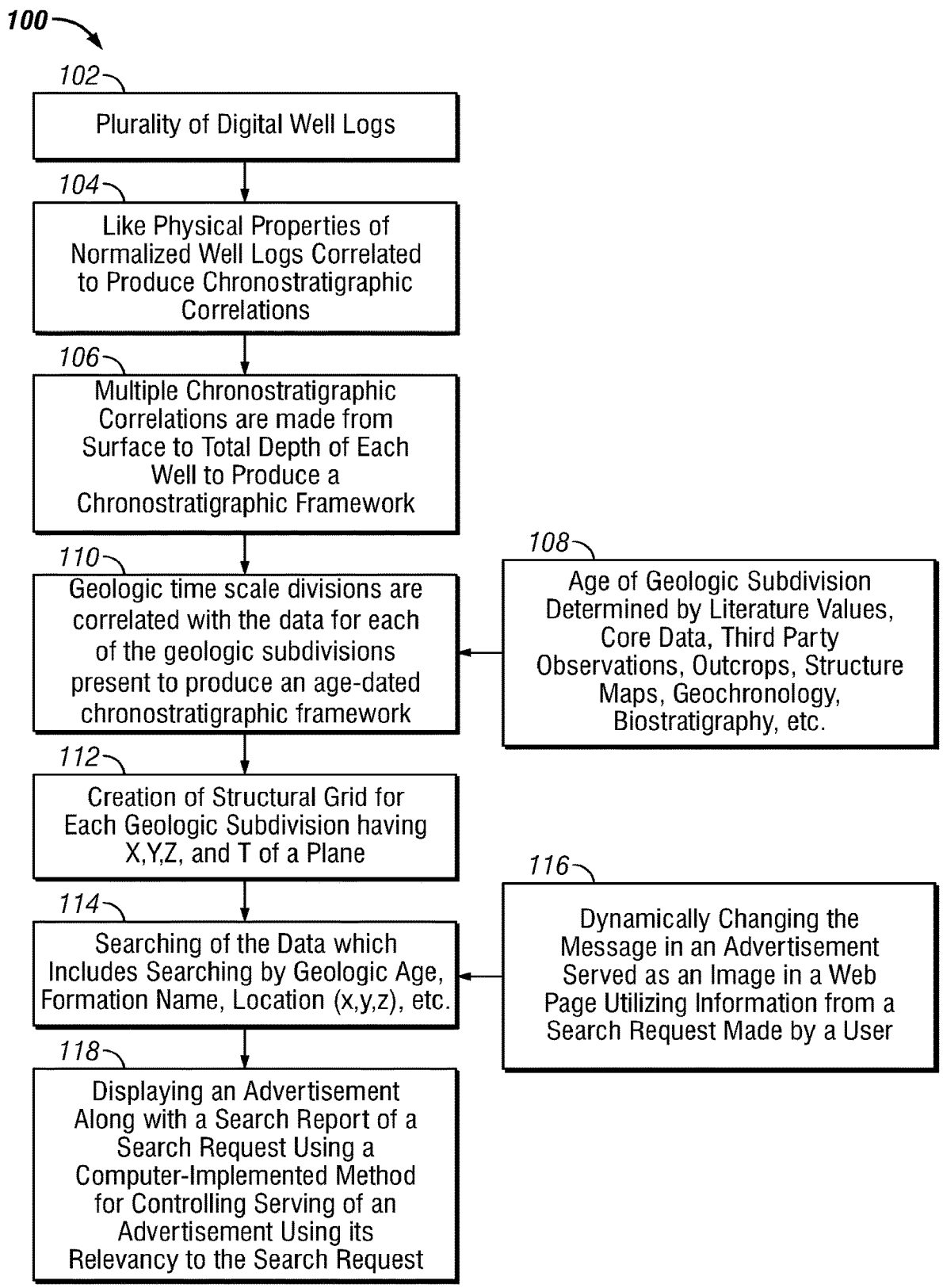
FIG. 1 is a schematic flow diagram of an embodiment of the method described herein.

In the development of any of the embodiments herein, numerous implementation-specific decisions must be made to achieve the developer's specific goals, such as compliance with system related and business related constraints, which will vary from one implementation to another. Moreover, it will be appreciated that such a development effort might be complex and time consuming but would nevertheless be a routine undertaking for those of ordinary skill in the art having the benefit of this disclosure.

As used in the specification and claims, "near" is inclusive of "at."

Surface and subsurface data are used in the exploration of mineral deposits, mining, water exploration, and the like. For example, the utility of existing data for the exploration of oil and gas is well known in the industry. Large amounts of existing well logs and production reports are filed with regulatory agencies in each oil and gas producing state which may be surveyed or "mined" to obtain historical information useful for additional drilling in existing fields and in adjacent geographic areas. Some of the external data needed to commence the process of building the basin-wide or multibasin map may be found in paper copies or raster images of existing well-logs available both from public and private sources, existing digital well logs which normally must be purchased, the location of wells located on detailed geographic maps or public or private databases, scout information about existing well activity available both from public and private sources, production information which may be obtained from both private and public sources and other cartographic information showing boundaries, county lines and similar information. A process to produce the X, Y, Z data provided in the chronostratigraphic database described herein is described in U.S. Pat. No. 7,054,753, which is fully incorporated by reference herein.

The digital log data creation process is the starting point for all analysis. The well logs, which are typically paper "hard copies" are scanned by conventional means well known to those in the industry, such as the NEURALOG™ scanner by way of example only. Any other suitable scanner known in the industry will work equally as well. The scanning process begins with a list of wells to be scanned created from scout data sorted by standard field definition categories that may vary from state-to-state or governmental authority over the territory of the wells of interest. This list of wells is typically compiled by determining which specific well logs will provide the most information about the given basins such that every well log for a given basin(s) may not need to be scanned to provide an accurate representation of the basins. The scanning process outputs digital image files called raster images. The raster images are typically in tagged image file format (TIFF). While this embodiment uses TIFF images by means of example, any digital image file format can be suitable depending on the scanning apparatus, software, and/or method utilized. The scanned TIFF files are indexed, typically with an API number (supplemented with an appended character to describe multiple images). The API number is merely a standardized number for the given oil or gas well. These scanned images are then archived in a database to permit their ready recall for subsequent use.

Although the well logs have been converted to a digital file format, the well logs still have not been digitized as the term is used in the instant disclosure. The scanned logs are next loaded using appropriate software such as the commercially available software available under the trade designation FINDER or a similar program using a conventional utility program typically named ld_lg_load. While FINDER is disclosed as being used in this embodiment, any similar software can work equally as well. To accomplish this action, wells are then selected based upon geologic and geographic criteria using appropriate log suites and intervals. The selected well log raster images are loaded using appropriate software such as the commercially available software available under the trade designation DIDGER. The digitizing process consists of tracing the digital image file and traced for the entire depth of the log to determine the location of each data point on the plot and generating a table of data that represents the plot in digital form. Output from this process is generally called LAS. This allows the oil and gas knowledge worker to easily manipulate the data.

Once each set of wells (or the designated curve of each well) is traced the digitized image is then ready to be calibrated. After loading the digitized well log into DIDGER, a standard calibration process can be used to provide a standardized depth or Z value range for the well log data measure that was digitized. For example, the calibration process typically can include calibrating the gamma ray or other measured curve values at each major increment such as every 100 feet of depth. This calibration action also permits the operator to inspect the well log to determine if errors have been incorporated into the log from the digitizing process and if necessary, to correct the errors. The calibrated curve can be exported to a Golden Software Boundary (GSB) formatted file or other similar file type and DIDGER can be used to resample the log at 0.5-foot intervals. Resampling or interpolating as used herein describes the process of converting data that may have been collected at non-constant intervals to a set of data representing the same physical phenomenon but at constant intervals. Resampling is a very useful processing algorithm for many types of curve comparisons and makes subsequent analysis much easier. An LAS file can be exported from DIDGER providing an API well number and the well log curve. LAS refers to Log ASCII Standard, a file format commonly used in the oil and gas exploration industry.

The desired calibrated well logs are typically normalized using a PERL script that utilizes standard statistical techniques to determine mean and standard deviation of the data distribution. PERL is a stable, cross platform programming language. It is used for mission critical projects in the public and private sectors and is widely used to program web applications of all needs. Additional information about PERL can be obtained at www.perl.org. While a PERL script is used in this embodiment, the type of script or other software used is not a critical feature. Any suitable software code that performs the desired function can work equally as well. Normalization can typically include utilizing standardized statistical techniques to fit a curve to the digitized data points and to calculate the accuracy of the curve using standard deviations, means, and other standard statistical techniques well known in the art. Maximum and minimum curve values can be calculated and the curve fit in these normalizing values. The PERL script typically outputs the data in a FINDER compatible file format for further processing. Manual normalization can be accomplished using FINDER's Log Trace Manager utility or other similar software in a manner well known to the industry. A special template can be created having equally spaced divisions to facilitate visual adjustment of the well log curve.

Once the created digital log is normalized, it can be used as the primary information for the stratigraphic framework creation process. Once the array of well logs are digitized and normalized, they can be visually displayed to show the common depositional characteristics. Since geological deposition proceeds over vast geographic areas and over millions of years, the correlation of related features in these well logs can be appreciated if they are arranged side by side with the important depositional features aligned (See FIG. 2). Visual continuity and manipulation can include, for example, removing grid lines, forming a reverse resistivity log trace, removing depth track and superimposing multiple logs in a single track. These manipulative techniques thereby allow well log displays to fully describe common geological characteristics from one well log to others both adjacent and remote. It is preferred to utilize a single type of well log from each well to create a visually clear cross-section display that can facilitate geologic correlation. The preferred log in more recently drilled fields are gamma ray logs. While gamma ray logs are the preferred single-type well logs, other logs can work equally as well.

In addition, various other forms of data may be used alone or in concert with well log data to determine the depositional characteristics of a stratum. Examples include utilizing seismic data, magnetometer data, and data produced by other forms of sub-surface geological characterization known to one of skill in the art. All of these data types and other subsurface data can be incorporated into the chronostratigraphic framework and thus age-dated. Likewise, embodiments described herein are not limited to oil and gas exploration, but may also be useful in explorations directed to mineral deposits, mining, water exploration, and the like.

Common sources of this existing external data are paper logs that must be rasterized and digitized to create images of well logs. Prior to obtaining external well logs, an inventory of existing well log information can be compiled and displayed on a base map of the basin or area under examination. Having once inventoried and displayed the existing information, a coordinated effort can be mounted to obtain missing or sparse well log information to more clearly define the area of interest. Gathering this information along with the top and base of each log run available permits early cross-sectional grid planning for the entire area or basin and permits early cost estimates of the digitizing process to be made at the commencement of the project. The inventory of existing logs typically identifies the most commonly available log in the basin and assists in the determination of the most likely log type for correlation of existing and future information. By performing this process before digitizing well logs, a potential cost savings can be realized by only digitizing well logs that are actually necessary to adequately characterize the area or basins.

Additionally, as technologies become more advanced and new types of measurement logs are utilized, the database or method according to the instant disclosure can be used in conjunction with these new types of logs. The database or method according to the instant disclosure does not require any specific type of well log or other attribute, but the use of the same type of well log or attribute for all wells can facilitate accurate correlation.

The identified depositional characteristics are then correlated with one or more attributes associated therewith, which include a set of age-tagged data points. The one or more attributes may comprise an age correlation (T) associated with a respective data point. In an embodiment, the age-tagged data point includes a geologic time event associated with that depositional characteristic. In an embodiment, the geologic time event is the geologic age of the materials, which may be expressed in terms of millions of years, by geologic era and/or by geologic period.

Geologic layers of Earth have been subdivided into a recognized geologic time scale. In an embodiment, all of the data points located within a particular depositional characteristic are correlated with the recognized geologic age of that depositional characteristic. In an embodiment, all points located within a particular layer or stratum are each correlated with the recognized geologic age of that stratum. Accordingly, all data points are defined by Cartesian coordinates X, Y, Z, and the geologic age of that material as time value T such that time becomes the fourth dimension.

In an embodiment, the geologic time event of a depositional feature may be determined by radiometric dating. In an embodiment, age may be determined based on the composition and characteristics of the rock, e.g., which exist in cores taken from a well. Examples include geochronology and biostratigraphy, wherein the age of the material is determined based on fossil assemblages present in the strata. In an embodiment, the geologic age may be determined by indirect or direct observations of related outcroppings of the depositional feature, by literature values of geologic formations, by structure maps, and/or any combination of direct or indirect methods.

In an embodiment, a chronostratigraphic database comprises a plurality of discrete data points, wherein each data point comprises an X, Y, Z and T value, wherein X, Y, and Z are Cartesian coordinates describing a position and T is a geologic time event relative to said position. In an embodiment, the chronostratigraphic database comprises a plurality of data points wherein X and Y are a longitude and latitude, Z is a depth relative to sea level, and T is a geologic age of the material located at that particular point. In an embodiment, the known geologic age of each data point is based at least in part on the physical properties of the geologic formation present at that particular point. In an embodiment, a method to determine the shape of a geologic formation comprises plotting a plurality of points from the chronostratigraphic database according to the instant disclosure which have the same geologic age within a selected geologic volume or space.

In an embodiment, a method to produce a chronostratigraphic database comprises correlating each of a plurality of well bore data points with the known geologic age of the geologic formation in which a particular data point is located, to produce a plurality of discrete data points, each comprising an X, Y, and Z location correlated to a T data point representing a geologic time event depositing the material located at that point. In an embodiment, X and Y represent the longitude and the latitude, Z represents the depth relative to sea level, and T represents the geologic age of the material located at that point. In still another embodiment, X, Y, Z, and T are determined by a) normalizing digitized well log data to produce a plurality of discrete data points;

b) correlating the normalized digitized well log data to locations identified on a geographic basin map to produce X, Y, and Z;

c) marking observable depositional features for each well using a standardized scale to create a stratigraphic framework for a said data; and d) correlating each data point within a depositional feature to known geologic time event T to produce the chronostratigraphic database. In an embodiment, the geologic time event is the geologic age of the material located at a particular point. In an embodiment, the geologic time event of a depositional feature is determined by direct measuring of cores taken from a well, by direct observation of the composition and characteristics of components which exist in cores taken from a well, by direct determination of related outcroppings of the depositional feature, by literature values of geologic formations, by structure maps, or a combination thereof. The correlation of the normalized digitized well log data to an identified geologic feature to create a stratigraphic framework for the said data may be accomplished in a plurality of different ways, including, but not limited to, seismic correlation, magnetics correlation, and the like.

In still another embodiment, at least one of the correlation actions, i.e., correlating the normalized digitized well log data to an identified geologic feature to create a stratigraphic framework for a said data and/or correlating each data point within a depositional feature to known geologic time event of the depositional feature T is a manual process. In another embodiment, at least one of the correlation actions, i.e., correlating the normalized digitized well log data to an identified geologic feature to create a stratigraphic framework for a said data and/or correlating each data point within a depositional feature to known geologic time event of the depositional feature T is an automated process. In an embodiment, the normalized digital well log data may be amplified or demodulated to show additional well information. The method may further comprise digitizing well log data to create the digitized well log data; calibrating the digital well log data prior to the normalization; saving the calibrated digital well log data as an LAS file; inventorying well log data prior to the digitizing, or a combination thereof.

In an embodiment, a method to produce a chronostratigraphic database comprises:

a) scanning a plurality of well logs to create raster images;

b) digitizing the raster images to create digitized well log data;

c) normalizing the digitized well log data to remove outlier data or errors in the data recording process;

d) scaling the normalized digitized well log data to emphasize the markers across multiple well logs;

e) correlating the normalized digitized well log data to identify markers in each depositional stratum; and f) correlating data points within a depositional stratum with the geologic age of the stratum. Where the geology is complex additional correlation data points of additional strata may optionally be added.

In an embodiment, the method may further comprise extracting formation tops to create visual display of formation surface and utilizing intersect surfaces of non-conformity surface with formation surface to create a truncation line for overlay on a visual display of chronostratigraphic maps. In an embodiment, the method may further comprise extracting formation tops to create visual display of formation surface; and utilizing intersect surfaces of non-conformity surface with formation surface to create a truncation line for overlay on a visual display of stratigraphic maps.

In an embodiment, the method may further comprise identifying suspected hydrocarbon bearing formations from maps produced using the data and/or may further comprise drilling a well into the identified suspected hydrocarbon bearing formation.

In an embodiment, the database is dimensioned and arranged to be compatible with various web-based mapping programs. Examples include those described in U.S. Pat. Nos. 6,377,296; 6,647,394; 6,724,382; 6,934,634; 7,158,878; 7,158,961; 7,209,148; 7,225,207; 7,236,881; 7,239,959; 7,315,259; 7,353,114; 7,373,246; 7,483,881; 7,512,487; 7,571,048; 7,576,754; 7,595,725; 7,599,790; 7,606,798; 7,616,217; 7,620,496; 7,643,673; 7,716,162; 7,730,389; 7,746,343; 7,747,598; 7,779,360; 7,792,883; 7,796,837; 7,801,897; 7,809,785; 7,822,751; 7,831,387; 7,831,438; 7,836,085; 7,840,407; 7,865,301; 7,869,667 their progeny, and the like, all of which are incorporated by reference herein.

In an embodiment, the various modeling systems, modeling methods, methods to produce a chronostratigraphic database, and/or the chronostratigraphic database according to the instant disclosure may further include one or more attributes associated with one or more data points comprising spatial coordinates (x, y, z) and one or more age correlations. In an embodiment, the depth or z spatial coordinate may be replaced by the age correlation whether or not the spatial coordinate actually includes a depth in the database such that the database serves to correlate a depth at a particular point with a geologic age or other time event. Accordingly, for purposes herein, a data point referred to by (x, y, z, T) is meant to include the same data point having (x, y, T) values. Furthermore, searching may be conducted of this database without requiring an age or time (T) value. The database may also be used with or without the time value in internet or web based searching applications which includes search applications in which advertising information is provided along with requested search reports.

In an embodiment, the one or more attributes which may be associated with a particular data point, preferably having (x, y, z, T) or a range of particular data points may include production data, geochemical data, points of perforation data, terrestrial sample data, paleontological data, temperature, pressure, fluid characteristic data, and the like. The one or more attributes associated with a particular data point (x, y, z, T) or a range of particular data points may also include descriptions of suppliers of commercial activities relevant to a particular location. Examples include information relevant to suppliers of products, services, and/or other commercial activities present at or near a particular location and/or information relevant to suppliers having various forms of specific information about a particular data point or range of particular data points which may or may not be generally available to the public, combinations thereof, and the like.

Examples of attributes associated with a particular data point which include descriptions of suppliers of commercial activities relevant to a particular location may further include sales or other information relevant to suppliers of equipment suitable for use at a particular location, consulting and other expertise related services relevant to a particular location, combinations thereof, and the like.

Examples of information relevant to suppliers having various forms of specific information about a particular data point or range of particular data points may include sales or other information relevant to suppliers of data having data relevant to a particular location, enterprises having access to privately held data about a particular location, data supply companies having information relevant to property ownership, mineral rights, and the like at a particular location, and the like.

In an embodiment, the one or more attributes associated with a particular data point, preferably having (x, y, z, T) or a range of particular data points may include information formatted and arranged for use with a method or process to produce advertisements (e.g., via web based or internet searching) which are selected based on a relevance or other score indicative of the advertisement information being relevant to one conducting a search which includes a particular geographical or geologic location or range of geographical or geologic locations associated with a time period as described herein.

In an embodiment, the chronostratigraphic database, modeling system, and/or modeling method, which may also include attributes associated with a particular data point (x, y, z, T) or a range of particular data points, may be formatted and arranged within a database to be suitable for use with the data structures, databases, processes and/or methods disclosed in U.S. Pat. Nos.: 5,400,248; 5,918,014; 5,948,061; 6,094,677; 6,816,857; 6,863,612; 6,915,271; 7,039,599; 7,085,682; 7,130,808; 7,136,875; 7,203,684; 7,249,056; 7,260,783; 7,346,606; 7,346,615; 7,349,827; 7,349,876; 7,363,302; 7,406,434; 7,428,555; 7,523,016; 7,523,387; 7,533,090; 7,546,625; 7,644,315; 7,647,242; 7,647,299; 7,657,514; 7,657,520; 7,657,611; 7,668,748; 7,668,832; 7,680,796; 7,697,791; 7,698,266; 7,712,141; 7,716,161; 7,725,502; 7,734,503; 7,752,072; 7,752,073; 7,756,741; 7,778,872; 7,788,132; 7,792,698; 7,792,743; 7,801,899; 7,802,280; 7,806,329; 7,818,207; 7,818,208; 7,827,060; 7,827,062; 7,831,658; 7,844,488; 7,844,493; 7,860,859; 7,873,536; 7,873,621; 7,873,765, their progeny, and the like; all of which are hereby incorporated by reference herein.

For example, in an embodiment, the chronostratigraphic database, modeling system, and/or modeling method, which may also include one or more attributes associated with a particular data point (x, y, z, T) or a range of particular data points may include information formatted and arranged for use with a computer-implemented method for controlling serving of an advertisement or public service message using its relevancy to a request, the method comprising: a) accepting, by a computer system including at least one computer, chronostratigraphic information such as x, y, z, or T, or formation name, etc. associated with the request and converting the chronostratigraphic information to an x, y, z, T location; b) comparing, by the computer system, the accepted x, y, z, T location associated with the request with chronostratigraphic targeting information associated with the advertisement or public service message to generate a comparison result; c) determining, by the computer system, the relevancy of the advertisement or public service message using at least the comparison result; d) controlling, by the computer system, the serving of the advertisement or public service message, for rendering on a client device, using the determined relevancy of the advertisement or public service message; e) determining, by the computer system, whether the advertisement or public service message has x, y, z, T location specific information corresponding to the chronostratigraphic information accepted; and f) if it is determined that the advertisement or public service message has x, y, z, T location specific information corresponding to the chronostratigraphic information accepted, then determining, by the computer system, a score using at least the x, y, z, T location specific information, otherwise determining, by the computer system, the score using at least generally relevant chronostratigraphic information of the advertisement or public service message, wherein the act of controlling the serving of the advertisement or public service message further uses the score of the advertisement or public service message, and wherein the chronostratigraphic targeting information associated with the advertisement or public service message corresponds to an area defined by at least one chronostratigraphic reference point.

For example, in an embodiment, the chronostratigraphic database, modeling system, and/or modeling method, which may also include one or more attributes associated with a particular data point (x, y, z, T) or a range of particular data points may include information formatted and arranged for use with a method, implemented in at least one computing device, of dynamically changing the messaging in an advertisement or public service message served as an image in a web page utilizing information from a web page requested by a user, the method comprising: receiving a request from a user for a web page at a web server; loading the web page; declaring the web page to an advertisement or public service message server; retrieving an advertisement or public service message based upon chronostratigraphic information such as x, y, z or T or formation name, etc. contained within variable definitions in the requested web page; delivering the retrieved advertisement or public service message to the web page; dynamically modifying the retrieved advertisement or public service message using the variable definitions in the requested web page in order to customize the advertisement or public service message in real time; and serving the retrieved and customized advertisement or public service message on the web page to the user.

For example, in an embodiment, the chronostratigraphic database, modeling system, and/or modeling method, which may also include one or more attributes associated with a particular data point (x, y, z, T) or a range of particular data points may include information formatted and arranged for use with a method, implemented in at least one computing device, of dynamically changing the messaging in an advertisement or public service message served as an image in a web page utilizing information from a web page requested by a user, the method comprising: receiving a request from a user for a web page at a web server; loading the web page; declaring the web page to an advertisement or public service message server; retrieving an advertisement or public service message based upon chronostratigraphic information such as x, y, z or T or formation name, etc. contained within variable definitions in the requested web page; delivering the retrieved advertisement or public service message to the web page; dynamically modifying the retrieved advertisement or public service message using the variable definitions in the requested web page in order to customize the advertisement or public service message in real time; and serving the retrieved and customized advertisement or public service message on the web page to the user.

In an embodiment, a chronostratigraphic modeling system comprises a database comprising a plurality of discrete subsurface data points comprising spatial coordinates (x, y, z) and one or more attributes associated therewith, including a set of age-tagged data points wherein the one or more attributes comprises an age correlation (T) associated with the respective data point, wherein the database is searchable by age and spatial coordinates. The chronostratigraphic modeling system may include spatial coordinates of longitude (x), latitude (y) and elevation (z). The database may comprise a plurality of data points with different latitudes, a plurality of data points with different longitudes, and a plurality of same location (x, y) data point sets having essentially the same latitude and longitude and different elevations.

In an embodiment, the chronostratigraphic modeling system may include data points having the same-location sets comprised of well log data or other forms of data. In an embodiment, a plurality of data points in a same location set may be tagged with an age correlation attribute. In an embodiment, the age correlation attribute may increase in value with increasing depth.

The chronostratigraphic modeling system may further comprise an interpolation tool to assign an age attribute to data points within a same location set having elevations spaced between age correlation attribute-tagged data points within the set. Likewise, the chronostratigraphic modeling system may further comprise a trending tool to assign an age attribute to data points within a same location set having elevations spaced away from an oldest or youngest one of the age correlation attribute-tagged data points within the set.

In an embodiment, the chronostratigraphic modeling system may further comprise a search engine for selecting data points by spatial coordinate, age correlation, formation name or a combination thereof. The chronostratigraphic modeling system may further comprise a display tool to display the selected data points. In an embodiment, the chronostratigraphic modeling system may display a same-age irregular plane surface of data points having a selected age correlation attribute (see FIG. 3). The chronostratigraphic modeling system may be searched according to the age, geologic time period name, formation name or any combination thereof. The display may further comprise a plurality of the same-age irregular plane surfaces of different selected ages, which may be in the form of subsurface isochron lines.

In an embodiment, the chronostratigraphic modeling system may further comprise a table linked to the search engine to correlate geologic time period names with geologic age, whereby the age correlation attribute is searchable by geologic time period including supereon, eon, era, period, epoch, age and/or chron, which may also be expressed in terms of eonothem, erathem, system, series, stage, and/or chronozone. See Table 1, below for a list of preferred geological time markers, names, chronological units, and system names. The database may also comprise data points from multiple depositional basin areas. In an embodiment, age correlation of the age-tagged data points may be based on similar attributes of nearby or adjacent datapoints.

TABLE 1

| Age (M Years) | System | Series |
|---|---|---|
| 0-0.0117 | Holocene | |
| 1 | Pleistocene | |
| 2 | Pliocene | |
| 5.3 | Miocene | Upper |
| 10.8 | | Middle |
| 17 | | Lower |
| 25 | Oligocene | Chickasawhayan |
| 33 | | Vicksburgian |
| 38 | Eocene | Jacksonian |
| 41 | | Claibornian |
| 50 | | Sabinian |
| 58 | Paleocene | Midwayan |
| 67 | Cretacious | Nevarroan |
| 72 | | Tayloran |
| 79 | | Austinian |
| 90 | | Eaglefordian |
| 94 | | Woodbinian |

TABLE 1-continued

| Age (M Years) | System | Series |
|---|---|---|
| 96 | | Fredricksburgian |
| 106 | | Trinitian |
| 111 | | Nuevoleonian |
| 125 | | Durangoan |
| 140 | Jurassic | Lacastian |
| 145 | | Zuloagan |
| 160 | | Middle |
| 180 | | Lower |
| 200 | Triassic | Upper |
| 235 | | Middle |
| 245 | | Lower |
| 250 | Permian | Ochoan-Guadalupian |
| 270 | | Leonardian |
| 275 | | Wolfcampian |
| 290 | Pennsylvanian | Virgilian |
| 291 | | Missourian |
| 292 | | Desmoinesian |
| 293 | | Atokan |
| 294 | | Morrowan |
| 330 | Mississippian | Chesterian |
| 340 | | Meramecian |
| 354 | | Osagean |
| 360 | | Kinderhookian |
| 365 | Devonian, Upper | Conewangoan |
| 370 | | Cassadagan |
| 380 | | Chemungian |
| 383 | | Fingerlakesian |
| 385 | Devonian, Middle | Erian |
| 390 | Devonian, Lower | Esopusian |
| 395 | | Deerparkian |
| 400 | | Helderbergian |
| 405 | Silurian | Cayugan |
| 408 | | Canastotan |
| 414 | | Lockportian |
| 415 | | Cliftonian |
| 420 | | Clintonian |
| 423 | | Alexandrian |
| 425 | Ordivician | Richmondian |
| 435 | | Maysvillian |
| 448 | | Edenian |
| 455 | | Trentonian |
| 456 | | Blackriverian |
| 460 | | Chazyan |
| 470 | | Whiterockian |
| 485 | | Canadian |
| 500 | Cambrian | Trempealeauan |
| 504 | | Franconian |
| 510 | | Dresbachian |
| 520 | | Middle Cambrian |

In an embodiment, a chronostratigraphic modeling method comprises searching a searchable database as described herein, and displaying the selected data points in an isochron selected from points, lines, surfaces, volumes and combinations thereof. The chronostratigraphic modeling method may include the use of spatial coordinates comprising longitude (x), latitude (y) and elevation (z), wherein the database comprises a plurality of data points with different latitudes, a plurality of data points with different longitudes, and a plurality of same location (x,y) data point sets having essentially the same latitude and longitude and different elevations, comprising tagging a plurality of data points in a same location set with an age correlation attribute. In an embodiment, the age correlation attribute may increase in value with increasing depth.

In an embodiment, the chronostratigraphic modeling method may further comprise interpolating to assign an age attribute to data points within a same location set having elevations spaced between age correlation attribute-tagged data points within the set. Likewise, the method may comprise extrapolating to assign an age attribute to data points within a same location set having elevations spaced away from an oldest or youngest one of the age correlation attribute-tagged data points within the set.

Although the description above contains many specifics, these should not be construed as limiting the scope of the instant disclosure but as merely providing illustrations of some of the presently preferred embodiments coming within the spirit and scope of the instant disclosure that is limited only by the accompanying claims. It is especially important to note that the software packages and file types described and used herein are not required software packages or file types. Any suitable software package or file type that performs a similar function is suitable for using the database or method according to the instant disclosure.

EXAMPLES

In an embodiment, as shown in FIG. 1, the chronostratigraphic database may by created by a process 100 comprising providing a plurality of digital well logs 102. These digital well logs may be provided according to the process disclosed in U.S. Pat. No. 7,054,753 or the like. In an embodiment, the digital well logs may be produced by digitizing well logs and normalizing the data.

Next, in a chronostratigraphic correlation action 104, depositional features present in the well logs are identified and similar physical properties of the normalized well logs may be grouped together or otherwise correlated to produce chronostratigraphic correlations between the data. In the chronostratigraphic framework action 106, multiple chronostratigraphic correlations are made from surface to total depth of each well to produce the chronostratigraphic framework. In the geologic time correlation action 110, geologic time scale divisions are assigned to each of the geologic subdivisions identified by the well log data. In this action, the Cartesian data in each of the identified depositional features are correlated to the geologic age of that feature to produce a dated chronostratigraphic framework. The geologic age determination 108 may be made according to literature values, core data, third party observations, outcrops, structure maps, geochronology, biostratigraphy, or any combination of such methods known to one of skill in the art. These data comprising the Cartesian coordinates correlated to the geologic time are then arranged in a database for subsequent retrieval, analysis and manipulation. In the structural grid action 112, the dated chronostratigraphic framework may then be used to produce a structural grid for one or more of the geologic subdivisions present. In an embodiment, these data may be grouped and analyzed to produce a representation of the shape of the surface determined according to a common age of the depositional feature or features. In a searching action 114, searching of the data may include searching based at least by one attribute, which may be geologic age. Searching may also include interne or web-based searching of the data. In an advertising action 116, the message in an advertisement served as an image in a web page utilizing information from a search request made by a user searching the data as described herein may be dynamically changed. In an alternative advertising action 118, an advertisement may be displayed along with a search report of a search request of the data using a computer-implemented method for controlling serving of an advertisement using its relevancy to the search request.

Figure 2:
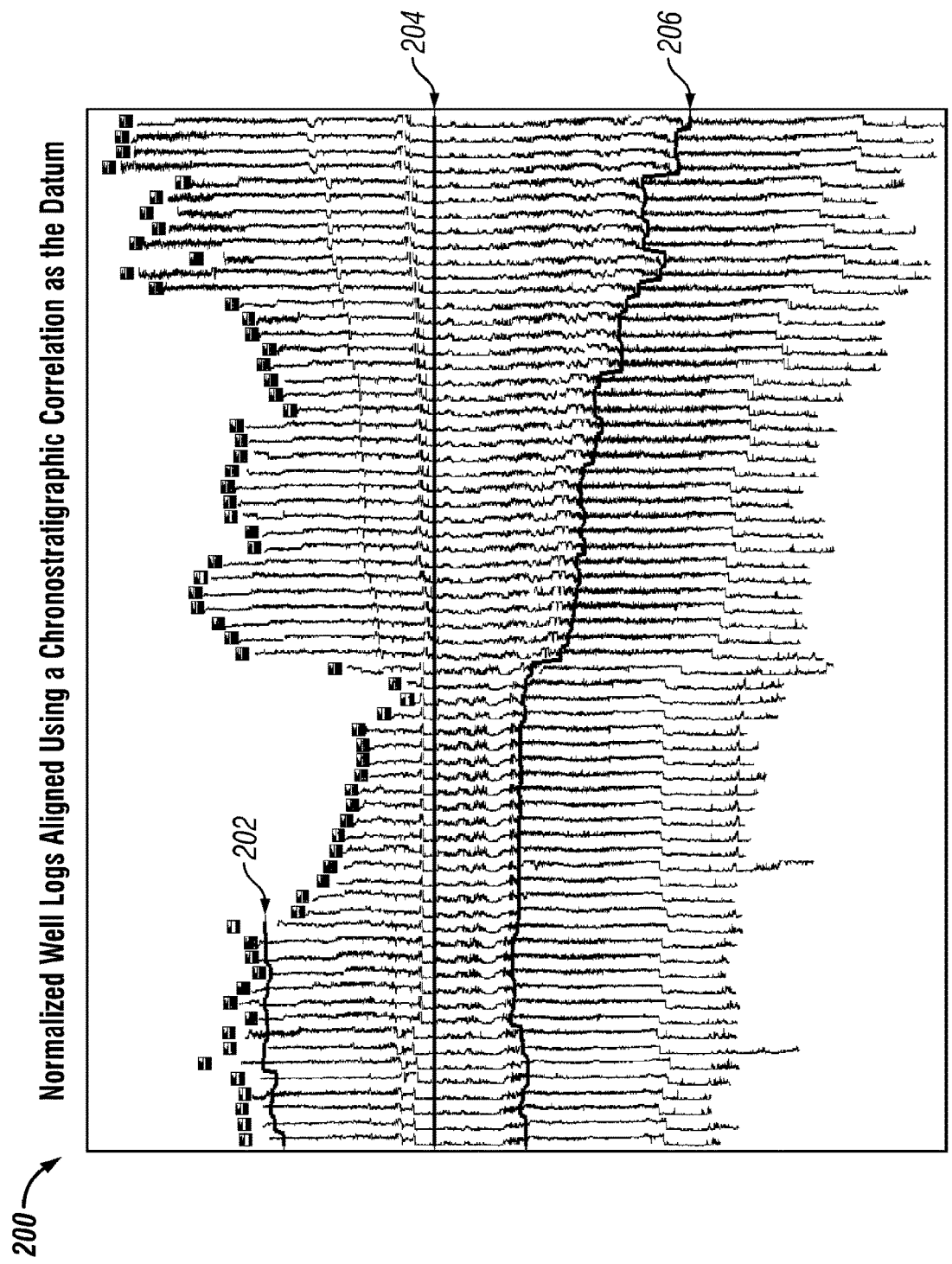
FIG. 2 illustrates a side by side arrangement of normalized well log data according to the instant disclosure.

FIG. 2 shows side by side arrangement of normalized well logs (200) wherein the depositional features are aligned using one chronostratigraphic correlation as a datum or surface used as a reference. This arrangement allows for a more complete description and characterization of a particular geologic area. As is shown in FIG. 2, the data may be aligned relative to the geologic age and the like. In FIG. 2, the chronostratigraphic correlation representing the Devonian system is indicated by line 202. The datum for this cross section is the chronostratigraphic correlation representing the Silurian system 204. A line indicating the chronostratigraphic correlation representing the Ordovician system is shown as 206. The description is enhanced when prepared according to the instant disclosure, wherein the geologic age of the depositional features is correlated to produce a contoured map of the depositional feature's surface over a particular area. The ability to correlate the depositional feature by geologic age further allows for determining the surface of a depositional feature over a relatively large geographical space, which is made possible using the dated chronostratigraphic database according to the instant disclosure.

Figure 3:
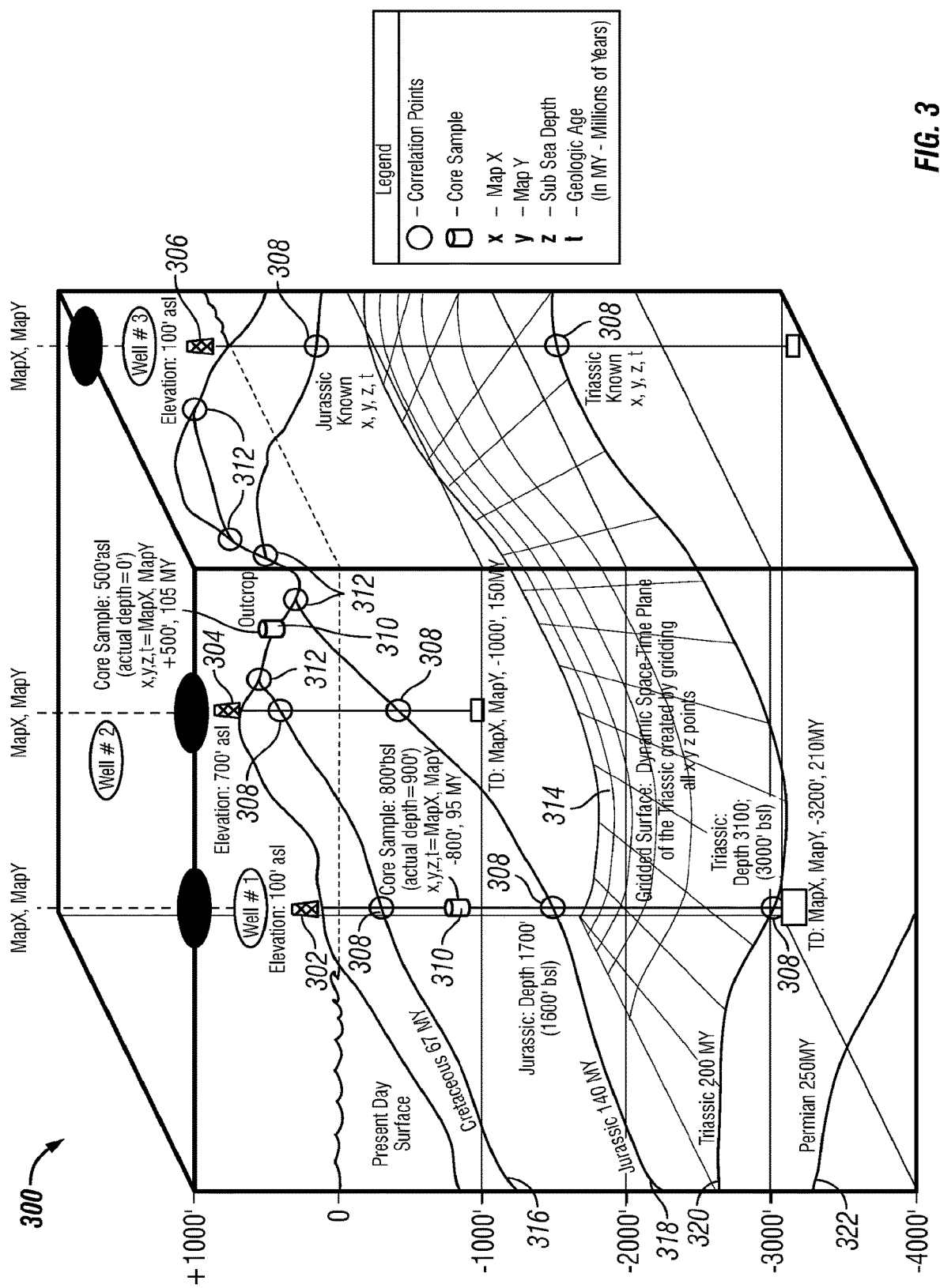
FIG. 3 illustrates a visual display of an isometric view of a 4 dimensional model of a basin produced according to an embodiment of the instant disclosure.

As shown in FIG. 3, in an embodiment, a contour map of a surface of a particular layer of strata may be determined within a four dimensional space 300 according to the present disclosure. Well logs from the wells present therein e.g., 302, 304, and 306, may be digitized and the geologic subdivisions i.e., Cretaceous 67MY (316), Jurassic 140 MY (318), Triassic 200 MY (320), and Permian 250 MY (322), determined therefrom and correlated using a plurality of correlation points 308 to produce a chronostratigraphic framework. In addition, data gathered from a plurality of core samples 310, outcrops 312, well logs, seismic readings and the like may be incorporated into the chronostratigraphic framework. An appropriate geologic age may then be determined and associated with each of the data points contained within or between a particular geologic subdivision to produce and enhance the age-dated chronostratigraphic framework and database. The data points between correlation points may be interpolated based on assumptions common in the art. The chronostratigraphic framework data may then be stored in a chronostratigraphic database for subsequent retrieval, analysis and manipulation. A contour map 314 describing the surface of a particular geologic subdivision (Triassic subdivision 320 shown) may then be produced utilizing the data in the chronostratigraphic database, as shown in FIG. 3. Each point along the surface may be described by the Cartesian coordinates X, Y, and Z, and further described by the geologic age T, in this case, 200 million years or by the accepted era or period name.

Embodiment Listing

Accordingly, the instant disclosure provides the following embodiments according to the disclosure:

A. A chronostratigraphic modeling system comprising a database comprising a plurality of discrete subsurface data points and optionally including surface data points, comprising spatial coordinates (x, y, z) and one or more attributes associated therewith, including a set of age-tagged data points wherein the one or more attributes comprises an age correlation (T) associated with the respective data point, wherein the database is searchable by age and spatial coordinates.

B. The chronostratigraphic modeling system according to Embodiment A, wherein the spatial coordinates comprise longitude (x), latitude (y) and elevation (z), wherein the database comprises a plurality of data points with different latitudes, a plurality of data points with different longitudes, and a plurality of same location (x, y) data point sets having essentially the same latitude and longitude and different elevations.

C. The chronostratigraphic modeling system according to Embodiment A or B, wherein the same-location data point sets comprise well log data.

D. The chronostratigraphic modeling system according to Embodiment A, B, or C, wherein a plurality of data points in a same location set are tagged with an age correlation attribute, wherein the age correlation attribute increases in value with increasing depth.

E. The chronostratigraphic modeling system according to Embodiment A, B, C, or D, further comprising an interpolation tool to assign an age attribute to data points within a same location set having elevations spaced between age correlation attribute-tagged data points within the set.

F. The chronostratigraphic modeling system according to Embodiment A, B, C, D, or E, further comprising a trending tool to assign an age attribute to data points within a same location set having elevations spaced away from an oldest or youngest one of the age correlation attribute-tagged data points within the set.

G. The chronostratigraphic modeling system according to Embodiment A, B, C, D, E, or F, further comprising a search engine for selecting data points by spatial coordinate, age correlation or a combination thereof.

H. The chronostratigraphic modeling system according to Embodiment A, B, C, D, E, F, or G, further comprising a display tool to display the selected data points.

I. The chronostratigraphic modeling system according to Embodiment A, B, C, D, E, F, G, or H, wherein the display comprises a same-age irregular plane surface of data points having a selected age correlation attribute.

J. The chronostratigraphic modeling system according to Embodiment A, B, C, D, E, F, G, H, or I, wherein the same age surface in the display is labeled with the age, geologic time period name, formation name, or a combination thereof.

K. The chronostratigraphic modeling system according to Embodiment A, B, C, D, E, F, G, H, I, or J, wherein the display comprises a plurality of the same-age irregular plane surfaces of different selected ages.

L. The chronostratigraphic modeling system according to Embodiment A, B, C, D, E, F, G, H, I, J, or K, wherein the display comprises a plurality of subsurface isochron lines.

M. The chronostratigraphic modeling system according to Embodiment A, B, C, D, E, F, G, H, I, J, K, or L, further comprising a table linked to the search engine to correlate geologic time period names with geologic age, whereby the age correlation attribute is searchable by geologic time period name, formation name, or a combination thereof.

N. The chronostratigraphic modeling system according to Embodiment A, B, C, D, E, F, G, H, I, J, K, L, or M, wherein the database comprises data points from multidepositional basin areas.

O. The chronostratigraphic modeling system according to Embodiment A, B, C, D, E, F, G, H, I, J, K, L, M or N, wherein the age correlation of the age-tagged data points is based on similar attributes of nearby or adjacent data points.

P. The chronostratigraphic modeling system according to Embodiment A, B, C, D, E, F, G, H, I, J, K, L, M, N, or O, wherein the database includes data formatted and arranged for use with a computer-implemented method for controlling serving of an advertisement or public service message using its relevancy to a request.

Q. The chronostratigraphic modeling system according to Embodiment A, B, C, D, E, F, G, H, I, J, K, L, M, N, O, or P, wherein the computer-implemented method for controlling serving of an advertisement or public service message using its relevancy to a request comprises:

accepting, by a computer system including at least one computer, chronostratigraphic information including x, y, z, T, the formation name, or a combination thereof associated with the request and converting the chronostratigraphic information to an x, y, z, T location;

comparing, by the computer system, the accepted chronostratigraphic information associated with the request with chronostratigraphic targeting information associated with the advertisement or public service message to generate a comparison result;

determining, by the computer system, the relevancy of the advertisement or public service message using at least the comparison result;

controlling, by the computer system, the serving of the advertisement or public service message, for rendering on a client device, using the determined relevancy of the advertisement or public service message;

determining, by the computer system, whether the advertisement or public service message has chronostratigraphic specific information corresponding to the chronostratigraphic information accepted; and if it is determined that the advertisement or public service message has chronostratigraphic specific information corresponding to the chronostratigraphic information accepted, then determining, by the computer system, a score using at least the chronostratigraphic specific information, otherwise determining, by the computer system, the score using at least generally relevant chronostratigraphic information of the advertisement or public service message, wherein the act of controlling the serving of the advertisement or public service message further uses the score of the advertisement or public service message, and wherein the chronostratigraphic targeting information associated with the advertisement or public service message corresponds to an area defined by at least one chronostratigraphic reference point.

R. The chronostratigraphic modeling system according to Embodiment A, B, C, D, E, F, G, H, I, J, K, L, M, N, O, P, or Q, wherein the database includes data formatted and arranged for use with a computer-implemented method, implemented in at least one computing device, of dynamically changing the messaging in an advertisement or public service message served as an image in a web page utilizing information from a search request made by a user.

S. The chronostratigraphic modeling system according to Embodiment A, B, C, D, E, F, G, H, I, J, K, L, M, N, O, P, Q, or R, wherein the computer-implemented method comprises receiving a request from a user for a web page at a web server;

loading the web page; declaring the web page to an advertisement or public service message server;

retrieving an advertisement or public service message based upon chronostratigraphic information contained within variable definitions in the requested web page;

delivering the retrieved advertisement or public service message to the web page;

dynamically modifying the retrieved advertisement or public service message using the variable definitions in the requested web page in order to customize the advertisement or public service message in real time, the variable definitions used to dynamically modify the retrieved advertisement or public service message comprising the chronostratigraphic information and second information; and serving the retrieved and customized advertisement or public service message on the web page to the user.

T. The chronostratigraphic modeling system according to Embodiment A, B, C, D, E, F, G, H, I, J, K, L, M, N, O, P, Q, R, or S, wherein the database includes one or more attributes associated with at least one data point or a range of data points which includes production data, geochemical data, points of perforation data, terrestrial sample data, paleontological data, temperature data, pressure data, fluid characteristic data, descriptions of suppliers of commercial activities relevant to the location described by the at least one data point or the range of data points, or a combination thereof.

U. A chronostratigraphic modeling method, comprising searching a searchable database comprising a plurality of discrete subsurface data points comprising spatial coordinates (x, y, z) and one or more attributes associated therewith, including a set of age-tagged data points wherein the one or more attributes comprises an age correlation (T) associated with the respective data point, and displaying the selected data points in an isochron selected from points, lines, grids, surfaces, volumes and combinations thereof.

V. The chronostratigraphic modeling method according to Embodiment U, wherein the spatial coordinates comprise longitude (x), latitude (y) and elevation (z), wherein the database comprises a plurality of data points with different latitudes, a plurality of data points with different longitudes, and a plurality of same location (x,y) data point sets having essentially the same latitude and longitude and different elevations, comprising tagging a plurality of data points in a same location set are tagged with an age correlation attribute, wherein the age correlation attribute increases in value with increasing depth.

W. The chronostratigraphic modeling method according to Embodiment U or V, further comprising interpolating to assign an age attribute to data points within a same location set having elevations spaced between age correlation attribute-tagged data points within the set.

X. The chronostratigraphic modeling method according to Embodiment U, V, or W, further comprising extrapolating to assign an age attribute to data points within a same location set having elevations spaced away from an oldest or youngest one of the age correlation attribute-tagged data points within the set.

Y. The chronostratigraphic modeling method according to Embodiment U, V, W, or X, wherein the display comprises a same-age irregular plane surface of data points having a selected age correlation attribute.

Z. The chronostratigraphic modeling method according to Embodiment U, V, W, X, or Y, further comprising labeling the isochron with the age, geologic time period name, formation name, or a combination thereof.

A1. The chronostratigraphic modeling method according to Embodiment U, V, W, X, Y, or Z, comprising specifying a geologic time period name or formation name as a search query, and converting the geologic time period name or formation name into a corresponding specified age, and searching the database by the specified age.

B1. The chronostratigraphic modeling method according to Embodiment U, V, W, X, Y, Z, or A1, wherein the spatial coordinates and age tags are determined by normalizing digitized well log data to produce a plurality of discrete data points;

marking observable depositional features for each digitized well log using a standardized scale to produce an X, Y, and Z framework;

correlating the normalized digitized well log data to an identified geologic formation to create a stratigraphic framework for said data; and correlating at least one data point within a depositional feature to known geologic time event of the depositional feature T to produce the chronostratigraphic database.

C1. The chronostratigraphic modeling method according to Embodiment U, V, W, X, Y, Z, A1, or B1, comprising determining the age tag for a depositional feature by direct measuring of cores taken from a well, by direct observation of the composition and characteristics of components which exist in cores taken from a well, by indirect and/or direct determination of related outcroppings of the depositional feature, by literature values of geologic formations, by structure maps, or a combination thereof.

D1. The chronostratigraphic modeling method according to Embodiment U, V, W, X, Y, Z, A1, B1, or C1, wherein the age tag determination is manual.

E1. The chronostratigraphic modeling method according to Embodiment U, V, W, X, Y, Z, A1, B1, C1, or D1, wherein the age tag determination is automatic.

F1. The chronostratigraphic modeling method according to Embodiment U, V, W, X, Y, Z, A1, B1, C1, D1, or E1, comprising amplifying or demodulating the normalized digital well log data to show additional well information.

G1. The chronostratigraphic modeling method according to Embodiment U, V, W, X, Y, Z, A1, B1, C1, D1, E1, or F1, further comprising digitizing well log data to create the digitized well log data.

H1. The chronostratigraphic modeling method according to Embodiment U, V, W, X, Y, Z, A1, B1, C1, D1, E1, F1, or G1, further comprising calibrating the digital well log data prior to the normalization.

I1. The chronostratigraphic modeling method according to Embodiment U, V, W, X, Y, Z, A1, B1, C1, D1, E1, F1, G1, or H1, further comprising saving the calibrated digital well log data as an LAS file.

J1. The chronostratigraphic modeling method according to Embodiment U, V, W, X, Y, Z, A1, B1, C1, D1, E1, F1, G1, H1, or I1, further comprising inventorying well log data prior to the digitizing.

K1. A method to produce a chronostratigraphic database comprising:

scanning a plurality of well logs to create raster images;

digitizing the raster images to create digitized well log data;

normalizing the digitized well log data to remove outlier data or errors in the data recording process;

scaling the normalized digitized well log data to emphasize the markers across multiple well logs;

correlating the normalized digitized well log data to identify markers in each depositional stratum; and tagging the markers within a depositional stratum with the geologic age of the stratum.

L1. A method to produce a chronostratigraphic database according to Embodiment K1, further comprising extracting formation tops to create visual display of formation surface; and utilizing intersect surfaces of non-conformity surface with formation surface to create a truncation line for overlay on a visual display of chronostratigraphic maps.

M1. A method to produce a chronostratigraphic database according to Embodiment K1 or L1, further comprising calibrating the digital well log data to a common scale prior to the normalization.

N1. A method to produce a chronostratigraphic database according to Embodiment K1, L1, or M1, further comprising selecting the well logs for the scanning based on areas of interest in a basin or a plurality of basins.

O1. A method to produce a chronostratigraphic database according to Embodiment K1, L1, M1, or N1, wherein the normalized digital well log data are amplified or demodulated to show additional well information.

P1. A method to produce a chronostratigraphic database according to Embodiment K1, L1, M1, N1, or O1, wherein at least one of the correlations is manual.

Q1. A method to produce a chronostratigraphic database according to Embodiment K1, L1, M1, N1, O1, or P1, wherein at least one of the correlations is automated.

R1. A method to produce a chronostratigraphic database according to Embodiment K1, L1, M1, N1, O1, P1, or Q1, wherein the digital well log data and normalized digital well log data are stored in a database.

S1. A method to produce a chronostratigraphic database according to Embodiment K1, L1, M1, N1, O1, P1, Q1, or R1, further comprising identifying suspected hydrocarbon bearing formations from maps produced using the data.

T1. A method to produce a chronostratigraphic database according to Embodiment K1, L1, M1, N1, O1, P1, Q1, R1 or S1, further comprising drilling a well into the identified suspected hydrocarbon bearing formation.

The foregoing disclosure and description is illustrative and explanatory thereof and it can be readily appreciated by those skilled in the art that various changes in the size, shape and materials, as well as in the details of the illustrated construction or combinations of the elements described herein can be made without departing from the spirit of the instant disclosure.

While the invention has been illustrated and described in detail in the drawings and foregoing description, the same is to be considered as illustrative and not restrictive in character, it being understood that only some embodiments have been shown and described and that all changes and modifications that come within the spirit of the inventions are desired to be protected. It should be understood that while the use of words such as preferable, preferably, preferred, more preferred or exemplary utilized in the description above indicate that the feature so described may be more desirable or characteristic, nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary. The foregoing disclosure and description is illustrative and explanatory thereof and it can be readily appreciated by those skilled in the art that various changes in the size, shape and materials, as well as in the details of the illustrated construction or combinations of the elements described herein can be made without departing from the spirit of the disclosure.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

What is claimed is:

1. A computer-implemented method for chronostratigraphic modeling, comprising:
identifying, with one or more hardware processors, a user request associated with a numerical geologic age attribute;
searching, with the one or more hardware processors in an automated computer process, at least one chronostratigraphic database by the numerical geologic age attribute and one or more with spatial coordinates, the at least one chronostratigraphic database comprising a plurality of surface data points each comprising well-log data, each of the surface data points associated with a plurality of discrete subsurface data points representative of a depth of a corresponding data point from the surface, each depth data point comprising an age correlation attribute tag (T) associated with a numerical geologic age of the strata at a depth identified by the particular data point, the numerical geological age correlation based on a plurality of data points obtained from a plurality of individual well logs across a portion of at least one geological basin, wherein the user request comprises a query of the at least one chronostratigraphic database that is compatible with at least one web-based mapping program, and the searching is responsive to the query and comprises the at least one web-based mapping program;
selecting, with the one or more hardware processors in the automated computer process, a plurality of selected data points from the at least one chronostratigraphic database based on the searching, the plurality of selected data points defined in an isochron selected from at least one of points, lines, grids, surfaces, or volumes; and
displaying, with the one or more hardware processors, a visual display of the plurality of selected data points for display to the user on a display tool.

2. The computer-implemented method of claim 1, further comprising interpolating, with the one or more hardware processors, to assign the age correlation attribute tag to a data point within a same location set having elevations spaced between two age correlation attribute-tagged data points within the location set.

3. The computer-implemented method of claim 1, wherein the plurality of selected data points comprises a same-numerical geologic age irregular plane surface comprising a plurality of data points having a selected age correlation attribute.

4. The computer-implemented method of claim 1, further comprising:
determining, with the one or more hardware processors, at least one of a geologic time period name or a formation name in a search query;
converting, with the one or more hardware processors, at least one of the geologic time period name or the formation name into a corresponding numerical geologic age; and
searching, with the one or more hardware processors, the at least one chronostratigraphic database by the numerical geologic age.

5. The computer-implemented method of claim 1, further comprising determining, with the one or more hardware processors, the spatial coordinates and the age correlation attribute tags.

6. The computer-implemented method of claim 5, wherein determining the spatial coordinates and the age correlation attribute tags comprises:
normalizing, with the one or more hardware processors, digitized well log data to produce a plurality of discrete data points;
correlating, with the one or more hardware processors, the normalized digitized well log data to an identified geologic formation to produce an x, y, and z data point for each of a plurality of marked depositional features, wherein one of x and y represents latitude and the other of x and y represents longitude and z is representative of the depth of the data point below the surface, to create a stratigraphic framework for said data points;
correlating, with the one or more hardware processors, at least one depth data point of the marked depositional features to a known geologic time event; and
correlating, with the one or more hardware processors, each depth data point with an age correlation attribute tag (T) representing a numerical geologic age of the stratum at a depth identified by the particular data point based on a plurality of data points obtained from a plurality of individual well logs across the at least one geologic basin.

7. The computer-implemented method of claim 6, further comprising digitizing, with the one or more hardware processors, analog well log data to create the digitized well log data.

8. The computer-implemented method of claim 1, further comprising generating, with the one or more hardware processors, the at least one chronostratigraphic database.

9. The computer-implemented method of claim 8, wherein generating the at least one chronostratigraphic database comprises:
scanning, with the one or more hardware processors, a plurality of well logs to create raster images;
digitizing, with the one or more hardware processors, the raster images to create digitized well log data;
normalizing, with the one or more hardware processors, the digitized well log data to remove outlier data or errors in the data recording process;
scaling, with the one or more hardware processors, the normalized digitized well log data according to markers across multiple digitized well logs;
correlating, with the one or more hardware processors, the normalized digitized well log data to identify numeric geologic age markers in each depositional stratum;
tagging, with the one or more hardware processors, each data point with an age correlation attribute (T) representing a numerical geologic age of a particular stratum at a depth identified by the particular data point, the numerical geological age correlation based on a plurality of data points obtained from a plurality of individual well logs across the at least one geologic basin; and storing, with the one or more hardware processors, the digitized well log data in a computer searchable database format to form the chronostratigraphic database.

10. The computer-implemented method of claim 9, further comprising:

extracting, with the one or more hardware processors, formation tops to create visual display of formation surface; and utilizing, with the one or more hardware processors, intersect surfaces of non-conformity surface with formation surface to create a truncation line for overlay on a visual display of chronostratigraphic maps.

11. The computer-implemented method of claim 9, further comprising calibrating, with the one or more hardware processors, the digitized well log data to a common scale prior to the normalization.

12. The computer-implemented method of claim 9, wherein the normalized digitized well log data are amplified or demodulated to show additional well information.

13. The computer-implemented method of claim 9, wherein the digitized well log data and normalized digitized well log data are stored in the at least one chronostratigraphic database.

14. The computer-implemented method of claim 9, further comprising, with the one or more hardware processors, identifying suspected hydrocarbon bearing formations from maps produced using the chronostratigraphic database.

15. The computer-implemented method of claim 14, further comprising identifying, with the one or more hardware processors, a particular hydrocarbon bearing formation for drilling a well.

16. The computer-implemented method of claim 9, wherein the age correlation attribute is further based on data obtained by at least one of:

direct measuring of cores taken from a well, direct observation of composition and characteristics of components in cores taken from a well, direct determination of related outcroppings of a depositional feature, literature values of geologic formations, or structure maps.

17. A distributed computing system for chronostratigraphic modeling, comprising:

at least one memory module that comprises at least one chronostratigraphic database; and one or more hardware processors communicably coupled to the memory module and operable to execute instructions stored on the at least one memory module to perform operations comprising:

identifying a user request associated with a numerical geologic age attribute;

searching, in an automated computer process, the at least one chronostratigraphic database by the numerical geologic age attribute and one or more with spatial coordinates, the at least one chronostratigraphic database comprising a plurality of surface data points each comprising well-log data, each of the surface data points associated with a plurality of discrete subsurface data points representative of a depth of a corresponding data point from the surface, each depth data point comprising an age correlation attribute tag (T) associated with a numerical geologic age of the strata at a depth identified by the particular data point, the numerical geological age correlation based on a plurality of data points obtained from a plurality of individual well logs across a portion of at least one geological basin, wherein the user request comprises a query of the at least one chronostratigraphic database that is compatible with at least one web-based mapping program, and the searching is responsive to the query and comprises the at least one web-based mapping program;

selecting, in the automated computer process, a plurality of selected data points from the at least one chronostratigraphic database based on the searching, the plurality of selected data points defined in an isochron selected from at least one of points, lines, grids, surfaces, or volumes; and displaying a visual display of the plurality of selected data points to the user on a display tool.

18. The distributed computing system of claim 17, wherein the operations further comprise interpolating to assign the age correlation attribute tag to a data point within a same location set having elevations spaced between two age correlation attribute-tagged data points within the location set.

19. The distributed computing system of claim 17, wherein the plurality of selected data points comprises a same-numerical geologic age irregular plane surface comprising a plurality of data points having a selected age correlation attribute.

20. The distributed computing system of claim 17, wherein the operations further comprise:

determining at least one of a geologic time period name or a formation name in a search query;

converting at least one of the geologic time period name or the formation name into a corresponding numerical geologic age; and searching the at least one chronostratigraphic database by the numerical geologic age.

21. The distributed computing system of claim 17, wherein the operations further comprise determining the spatial coordinates and the age correlation attribute tags.

22. The distributed computing system of claim 21, wherein determining the spatial coordinates and the age correlation attribute tags comprises:

normalizing digitized well log data to produce a plurality of discrete data points;

correlating the normalized digitized well log data to an identified geologic formation to produce an x, y, and z data point for each of a plurality of marked depositional features, wherein one of x and y represents latitude and the other of x and y represents longitude and z is representative of the depth of the data point below the surface, to create a stratigraphic framework for said data points;

correlating at least one depth data point of the marked depositional features to a known geologic time event; and correlating each depth data point with an age correlation attribute tag (T) representing a numerical geologic age of the stratum at a depth identified by the particular data point based on a plurality of data points obtained from a plurality of individual well logs across the at least one geologic basin.

23. The distributed computing system of claim 22, wherein the operations further comprise digitizing analog well log data to create the digitized well log data.

24. The distributed computing system of claim 17, wherein the operations further comprise generating the at least one chronostratigraphic database.

25. The distributed computing system of claim 24, wherein generating the at least one chronostratigraphic database comprises:
- scanning a plurality of well logs to create raster images;
- digitizing the raster images to create digitized well log data;
- normalizing the digitized well log data to remove outlier data or errors in the data recording process;
- scaling the normalized digitized well log data according to markers across multiple digitized well logs;
- correlating the normalized digitized well log data to identify numeric geologic age markers in each depositional stratum;
- tagging each data point with an age correlation attribute (T) representing a numerical geologic age of a particular stratum at a depth identified by the particular data point, the numerical geological age correlation based on a plurality of data points obtained from a plurality of individual well logs across the at least one geologic basin; and
- storing the digitized well log data in a computer searchable database format to form the chronostratigraphic database.

26. The distributed computing system of claim 24, wherein the operations further comprise:
- extracting formation tops to create visual display of formation surface; and
- utilizing intersect surfaces of non-conformity surface with formation surface to create a truncation line for overlay on a visual display of chronostratigraphic maps.

27. The distributed computing system of claim 24, wherein the operations further comprise calibrating the digitized well log data to a common scale prior to the normalization.

28. The distributed computing system of claim 24, wherein the normalized digitized well log data are amplified or demodulated to show additional well information.

29. The distributed computing system of claim 24, wherein the digitized well log data and normalized digitized well log data are stored in the at least one chronostratigraphic database.

30. The distributed computing system of claim 24, wherein the operations further comprise identifying suspected hydrocarbon bearing formations from maps produced using the chronostratigraphic database.

31. The distributed computing system of claim 30, wherein the operations further comprise identifying a particular hydrocarbon bearing formation for drilling a well.

32. The distributed computing system of claim 24, wherein the age correlation attribute is further based on data obtained by at least one of:
- direct measuring of cores taken from a well,
- direct observation of composition and characteristics of components in cores taken from a well,
- direct determination of related outcroppings of a depositional feature,
- literature values of geologic formations, or
- structure maps.

* * * * *